US012787377B2

(12) United States Patent
Han et al.

(10) Patent No.: US 12,787,377 B2
(45) Date of Patent: Nov. 3, 2026

(54) PILLAR STRUCTURE INCLUDING BRANCHED UPPER PERIPHERAL PILLARS AND SUPER JUNCTION SEMICONDUCTOR DEVICE INCLUDING THE SAME

(71) Applicant: DB HITEK CO., LTD., Gangnam-gu Seoul (KR)

(72) Inventors: Yong Sin Han, Seo-gu (KR); Myeong Bum Pyun, Namdong-gu (KR)

(73) Assignee: DB HITEK CO., LTD., Gangnam-gu (KR)

( * ) Notice: Subject to any disclaimer, the term of this patent is extended or adjusted under 35 U.S.C. 154(b) by 390 days.

(21) Appl. No.: 18/622,574

(22) Filed: Mar. 29, 2024

(65) Prior Publication Data

US 2025/0227966 A1 Jul. 10, 2025

(30) Foreign Application Priority Data

Jan. 10, 2024 (KR) ........................ 10-2024-0003945

(51) Int. Cl.
*H10D 62/10* (2025.01)
*H10D 30/66* (2025.01)

(52) U.S. Cl.
CPC ........... *H10D 62/111* (2025.01); *H10D 30/66* (2025.01); *H10D 62/127* (2025.01)

(58) Field of Classification Search
CPC .. H10D 62/111; H10D 62/127; H10D 62/393; H10D 62/152; H10D 30/66; H10D 30/665; H10D 62/105
See application file for complete search history.

(56) References Cited

U.S. PATENT DOCUMENTS

| | | | | |
|---|---|---|---|---|
| 2019/0305088 | A1 | 10/2019 | Bobde et al. | |
| 2022/0069075 | A1* | 3/2022 | Lee | H10D 30/0291 |
| 2023/0223435 | A1* | 7/2023 | Han | H10D 30/665 257/213 |
| 2023/0282696 | A1* | 9/2023 | Wang | H10D 30/665 |
| 2024/0097021 | A1* | 3/2024 | Motai | H10D 12/481 |
| 2024/0128381 | A1* | 4/2024 | Tseng | H10D 8/422 |

FOREIGN PATENT DOCUMENTS

| | | | |
|---|---|---|---|
| CN | 204857728 | U * | 12/2015 |
| KR | 102013022798 | A | 3/2013 |
| KR | 102020015350 | A | 9/2020 |

* cited by examiner

*Primary Examiner* — William B Partridge
*Assistant Examiner* — Noah C. Robertson
(74) *Attorney, Agent, or Firm* — Seed Intellectual Property Law Group LLP

(57) ABSTRACT

A pillar structure of a super junction semiconductor device includes a semiconductor layer having a first conductivity type and pillars having a second conductivity type. The semiconductor layer includes an active region and a peripheral region surrounding the active region. The pillars extend in a vertical direction within the semiconductor layer and extend in a horizontal direction across the active region and the peripheral region. Each of the pillars includes an active pillar disposed within the active region, a lower peripheral pillar disposed within the peripheral region and connected to the active pillar, and a pair of upper peripheral pillars disposed on the lower peripheral pillar and branching from the active pillar.

16 Claims, 6 Drawing Sheets

PILLAR STRUCTURE INCLUDING BRANCHED UPPER PERIPHERAL PILLARS AND SUPER JUNCTION SEMICONDUCTOR DEVICE INCLUDING THE SAME

CROSS-REFERENCE TO RELATED APPLICATION

This application claims the priority benefit of Korean Patent Application No. 10-2024-0003945, filed on Jan. 10, 2024, and all the benefits accruing therefrom under 35 U.S.C. § 119, the contents of which are incorporated by reference in their entirety.

TECHNICAL FIELD

The present disclosure relates to a pillar structure and a super junction semiconductor device including the same. More specifically, the present disclosure relates to a pillar structure including a semiconductor layer having a first conductivity type and pillars disposed within the semiconductor layer and having a second conductivity type, and a super junction semiconductor device including the pillar structure.

BACKGROUND

Generally, a high-voltage semiconductor device such as a power metal-oxide semiconductor field-effect transistor (MOSFET) and an insulated gate bipolar transistor (IGBT) includes a semiconductor layer functioning as a drift region, a gate electrode and a source electrode disposed on the semiconductor layer, and a drain electrode disposed below the semiconductor layer.

For example, the semiconductor layer may have a super junction structure including P-type pillars and N-type pillars. The semiconductor layer may provide a conductive path for drift current flowing from the drain electrode to the source electrode in a turn-on state of the semiconductor device, and may provide a depletion region that expands in a vertical direction by a reverse bias voltage applied in a turn-off state.

The breakdown voltage of the semiconductor device having the super junction structure as described above may be determined by the depletion region provided by the semiconductor layer. However, a high electric field may be formed locally at upper portions of the pillars, and thus the actual breakdown voltage of the semiconductor device may be lower than the theoretically calculated breakdown voltage.

SUMMARY

The present disclosure is intended to solve the above problems, and provides a pillar structure that can form an electric field uniformly overall by alleviating local electric field concentration, and a super junction semiconductor device including the same.

In accordance with an aspect of the present disclosure, a pillar structure may include a semiconductor layer having a first conductivity type and pillars having a second conductivity type. The semiconductor layer may include an active region and a peripheral region surrounding the active region. The pillars may extend in a vertical direction within the semiconductor layer and may extend in a horizontal direction across the active region and the peripheral region. Each of the pillars may include an active pillar disposed within the active region, a lower peripheral pillar disposed within the peripheral region and connected to the active pillar, and a pair of upper peripheral pillars disposed on the lower peripheral pillar and branching from the active pillar. The pair of upper peripheral pillars may branch from an interface between the active region and the peripheral region, and may include a pair of connecting portions connected to the active pillar and a pair of extending portions each extending in the horizontal direction from the pair of connecting portions. The pair of connecting portions may be spaced apart from each other on the interface.

In accordance with some embodiments of the present disclosure, the pillar structure may further include body regions having the second conductivity type and each disposed between an upper surface of the semiconductor layer and the pillars.

In accordance with some embodiments of the present disclosure, a distance between the pair of connecting portions may gradually increase in the horizontal direction.

In accordance with some embodiments of the present disclosure, the each of the pillars may further include a pair of expanding portions disposed within the active region and connecting the connecting portions and the active pillar.

In accordance with another aspect of the present disclosure, a super junction semiconductor device may include a substrate having a first conductivity type, a semiconductor layer having the first conductivity type and disposed on the substrate, pillars having a second conductivity type and disposed within the semiconductor layer, and body regions having the second conductivity type and each disposed between an upper surface of the semiconductor layer and the pillars. The semiconductor layer may include an active region and a peripheral region surrounding the active region. The pillars may extend in a vertical direction within the semiconductor layer and may extend in a horizontal direction across the active region and the peripheral region. Each of the pillars may include an active pillar disposed within the active region, a lower peripheral pillar disposed within the peripheral region and connected to the active pillar, and a pair of upper peripheral pillars disposed on the lower peripheral pillar and branching from the active pillar. The pair of upper peripheral pillars may branch from an interface between the active region and the peripheral region, and may include a pair of connecting portions connected to the active pillar and a pair of extending portions each extending in the horizontal direction from the pair of connecting portions. The pair of connecting portions may be spaced apart from each other on the interface.

In accordance with some embodiments of the present disclosure, a distance between the pair of connecting portions may gradually increase in the horizontal direction.

In accordance with some embodiments of the present disclosure, the each of the pillars may further include a pair of expanding portions disposed within the active region and connecting the connecting portions and the active pillar.

In accordance with some embodiments of the present disclosure, the super junction semiconductor device may further include gate electrodes extending in the horizontal direction and disposed on the semiconductor layer between the body regions, gate insulating layers disposed between the semiconductor layer and the gate electrodes, and source regions disposed in surface portions of the body regions.

In accordance with some embodiments of the present disclosure, the body regions may include first body regions disposed in the active region and second body regions disposed in the peripheral region. In such case, the source regions may be disposed in surface portions of the first body regions.

In accordance with some embodiments of the present disclosure, the super junction semiconductor device may further include an interlayer insulating layer disposed on the gate electrodes and the body regions, a source electrode disposed on the interlayer insulating layer, and source contacts connecting the source electrode and the source regions through the interlayer insulating layer.

In accordance with some embodiments of the present disclosure, the source contacts may be connected to the first body regions through the source regions.

In accordance with some embodiments of the present disclosure, the super junction semiconductor device may further include body contacts connecting the source electrode and the second body regions through the interlayer insulating layer.

In accordance with some embodiments of the present disclosure, the semiconductor layer may further include a transition region disposed between the active region and the peripheral region. In such case, the pillars may extend across the transition region in the horizontal direction.

In accordance with some embodiments of the present disclosure, the pillars may further include transition pillars disposed in the transition region. In such case, a diffusion region having the second conductivity type may be disposed on the transition pillars, and a reverse recovery region having the second conductivity type and an impurity concentration higher than that of the diffusion region may be disposed on the diffusion region.

In accordance with some embodiments of the present disclosure, the super junction semiconductor device may further include second pillars having the second conductivity type. The second pillars may extend in the vertical direction and the horizontal direction within a portion of the peripheral region disposed on one side of the transition region.

In accordance with some embodiments of the present disclosure, a second diffusion region having the second conductivity type may be disposed on a second pillar adjacent to the transition region among the second pillars, and a RESURF (Reduced Surface Field) region having the second conductivity type and having an impurity concentration lower than that of the second diffusion region may be disposed on remaining second pillars.

In accordance with the embodiments of the present disclosure as described above, the upper peripheral pillars branching from the active pillars in the horizontal direction may be disposed in upper portions of the peripheral region. The upper peripheral pillars may increase PN junction area in the upper portions of the peripheral region. Accordingly, the electric field may be prevented from being concentrated in the upper portions of the peripheral region, and thus, the breakdown voltage of the super junction semiconductor device may be significantly improved.

The above summary of the present disclosure is not intended to describe each illustrated embodiment or every implementation of the present disclosure. The detailed description and claims that follow more particularly exemplify these embodiments.

BRIEF DESCRIPTION OF THE DRAWINGS

Embodiments can be understood in more detail from the following description taken in conjunction with the accompanying drawings, in which.

Figure 1:
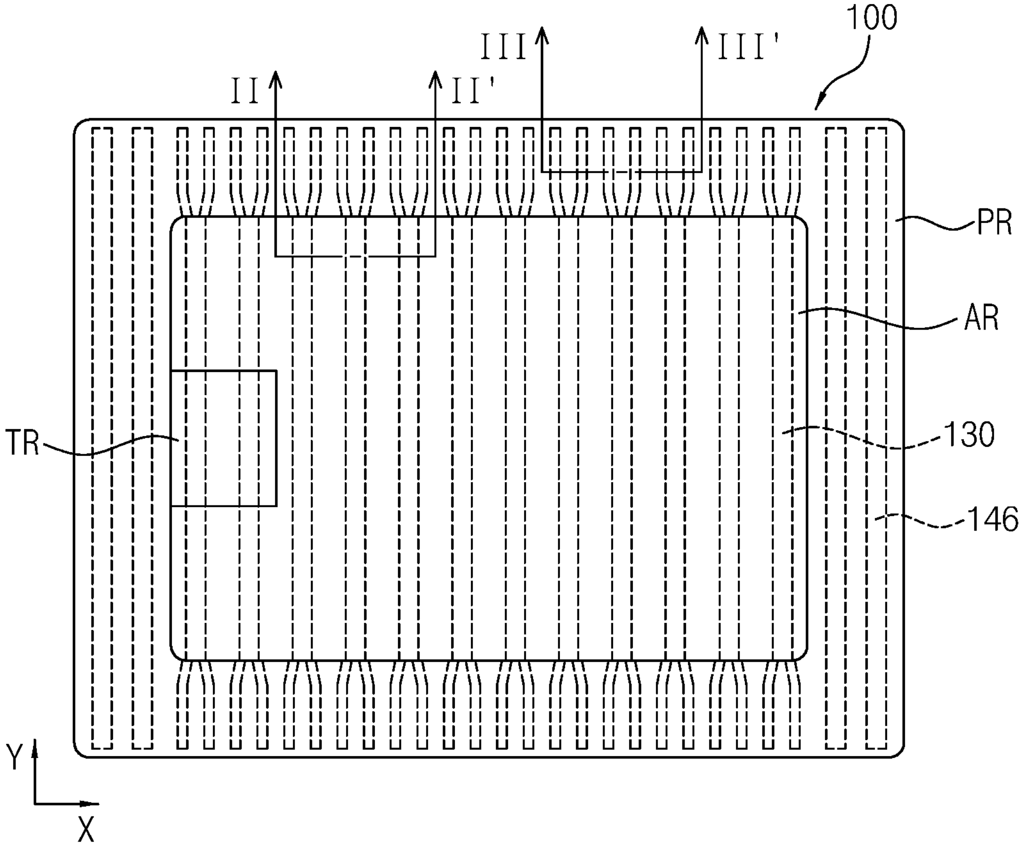
FIG. 1 is a schematic plan view illustrating a super junction semiconductor device in accordance with an embodiment of the present disclosure.

While various embodiments are amenable to various modifications and alternative forms, specifics thereof have been shown by way of example in the drawings and will be described in detail. It should be understood, however, that the intention is not to limit the claimed inventions to the particular embodiments described. On the contrary, the intention is to cover all modifications, equivalents, and alternatives falling within the spirit and scope of the subject matter as defined by the claims.

DETAILED DESCRIPTION

Hereinafter, embodiments of the present disclosure are described in more detail with reference to the accompanying drawings. However, the present disclosure is not limited to the embodiments described below and is implemented in various other forms. Embodiments below are not provided to fully complete the present disclosure but rather are provided to fully convey the range of the present disclosure to those skilled in the art.

In the specification, when one component is referred to as being on or connected to another component or layer, it can be directly on or connected to the other component or layer, or an intervening component or layer may also be present. Unlike this, it will be understood that when one component is referred to as directly being on or directly connected to another component or layer, it means that no intervening component is present. Also, though terms like a first, a second, and a third are used to describe various regions and layers in various embodiments of the present disclosure, the regions and the layers are not limited to these terms.

Terminologies used below are used to merely describe specific embodiments, but do not limit the present disclosure. Additionally, unless otherwise defined here, all the terms including technical or scientific terms, may have the same meaning that is generally understood by those skilled in the art.

Embodiments of the present disclosure are described with reference to schematic drawings of ideal embodiments. Accordingly, changes in manufacturing methods and/or allowable errors may be expected from the forms of the drawings. Accordingly, embodiments of the present disclosure are not described being limited to the specific forms or areas in the drawings, and include the deviations of the forms. The areas may be entirely schematic, and their forms may not describe or depict accurate forms or structures in any given area, and are not intended to limit the scope of the present disclosure.

Figure 2:
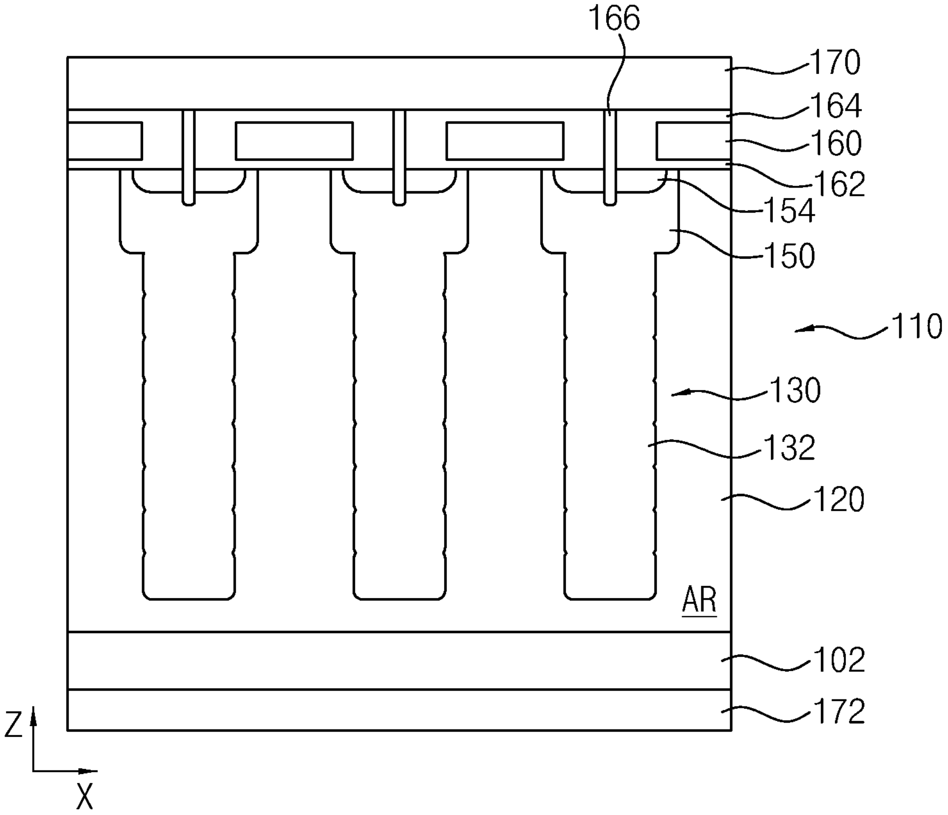
FIG. 2 is a schematic cross-sectional view taken along line II-II' as shown in FIG. 1.

FIG. 1 is a schematic plan view illustrating a super junction semiconductor device in accordance with an embodiment of the present disclosure. FIG. 2 is a schematic cross-sectional view taken along line II-II' as shown in FIG.

Figure 3:
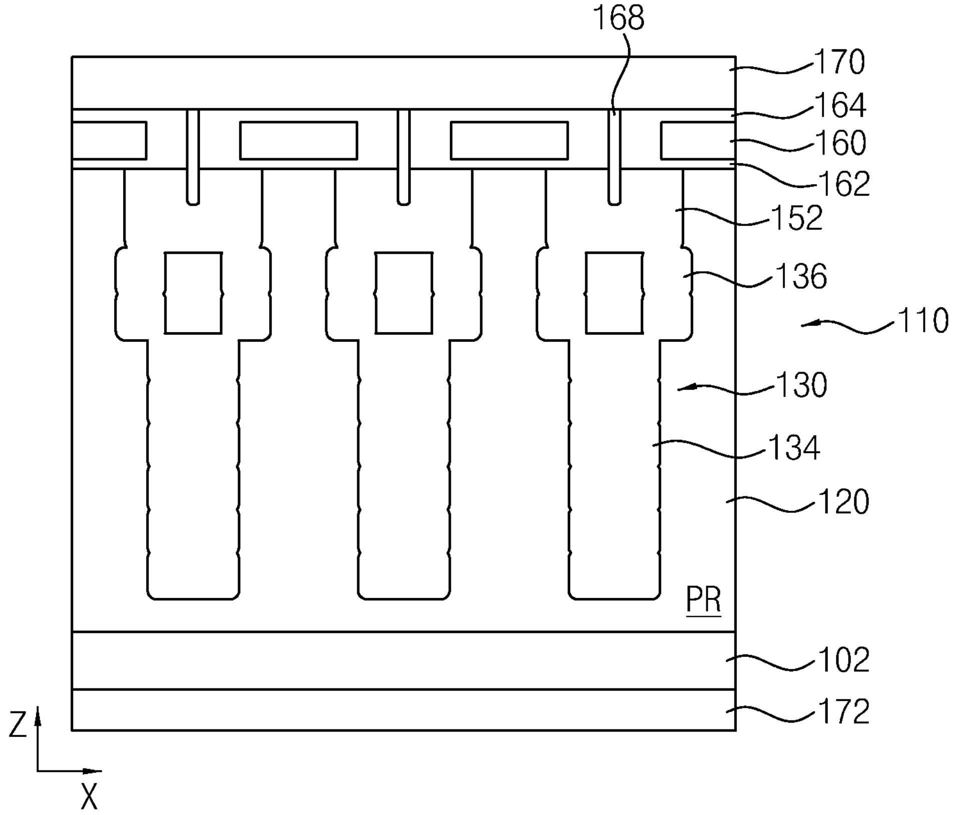
FIG. 3 is a schematic cross-sectional view taken along line III-III' as shown in FIG. 1.

1, and FIG. 3 is a schematic cross-sectional view taken along line III-III' as shown in FIG. 1.

Referring to FIGS. 1 to 3, a super junction semiconductor device 100, in accordance with an embodiment of the present disclosure, may include a substrate 102 having a first conductivity type, and a pillar structure 110 formed on the substrate 102. The pillar structure 110 may include a semiconductor layer 120 formed on the substrate 102 and having the first conductivity type, pillars 130 formed within the semiconductor layer 120 and having a second conductivity type, and body regions 150 and 152 formed between an upper surface of the semiconductor layer 120 and the pillars 130 and having the second conductivity type.

The semiconductor layer 120 may include an active region AR and a peripheral region PR surrounding the active region AR. The pillars 130 may extend in a vertical direction within the semiconductor layer 120, and may extend in a horizontal direction across the active region AR and the peripheral region PR. For example, as shown in FIG. 1, the pillars 130 may extend parallel to each other in a Y-axis direction. Further, the pillar structure 110 may include second pillars 146 that extend across the peripheral region PR in the Y-axis direction and have the second conductivity type. Specifically, the second pillars 146 may disposed within side portions of the peripheral region PR, which are disposed on both sides of the active region AR in a second horizontal direction perpendicular to the horizontal direction, for example, an X-axis direction as shown in FIG. 1. The second pillars 146 may extend in the vertical direction within the side portions of the peripheral region PR and may extend parallel to the pillars 130 in the Y-axis direction.

In accordance with an embodiment of the present disclosure, each of the pillars 130 may include an active pillar 132 formed in the active region AR and a peripheral pillar formed in the peripheral region PR. The peripheral pillar may include a lower peripheral pillar 134 connected to the active pillar 132, and a pair of upper peripheral pillars 136 formed on the lower peripheral pillar 134 and branching from the active pillar 132 in the Y-axis direction. Further, the pair of upper peripheral pillars 136 may branch upward from the lower peripheral pillar 134.

Figure 4:
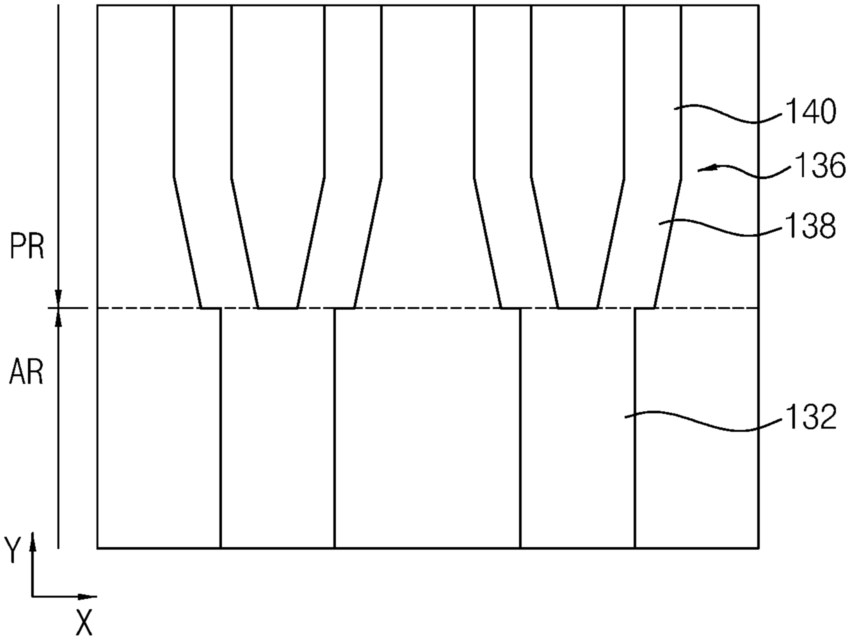
FIG. 4 is a schematic enlarged plan view illustrating active pillars and upper peripheral pillars as shown in FIGS. 2 and 3.
Figure 5:
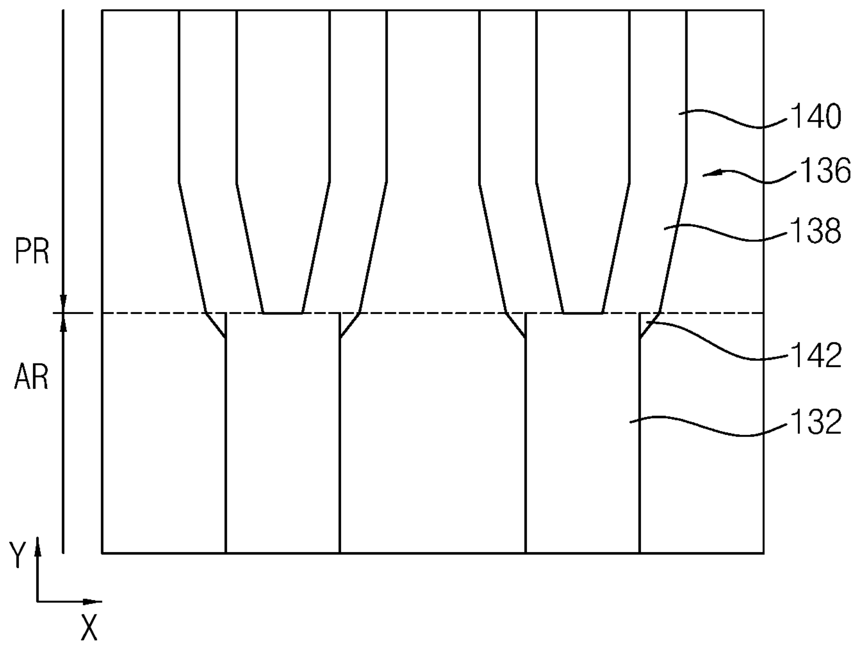
FIG. 5 is a schematic enlarged plan view illustrating another example of the active pillars and the upper peripheral pillars as shown in FIG. 4.

FIG. 4 is a schematic enlarged plan view illustrating active pillars and upper peripheral pillars as shown in FIGS. 2 and 3, and FIG. 5 is a schematic enlarged plan view illustrating another example of the active pillars and the upper peripheral pillars as shown in FIG. 4.

Referring to FIG. 4, the pair of upper peripheral pillars 136 may branch in the Y-axis direction from an interface between the active region AR and the peripheral region PR. Further, the pair of upper peripheral pillars 136 may include a pair of connecting portions 138 connected to the active pillar 132, and a pair of extending portions 140 each extending from the pair of connecting portions 138 in the Y-axis direction.

In particular, the pair of connecting portions 138 may be spaced apart from each other in a second horizontal direction perpendicular to the horizontal direction, for example, in the X-axis direction, on the interface between the active region AR and the peripheral region PR. That is, the pair of connecting portions 138 may be spaced apart from each other in the X-axis direction on the interface. Further, a distance between the pair of connecting portions 138 may gradually increase in the Y-axis direction.

As another example, as shown in FIG. 5, the each of the pillars 130 may further include a pair of expanding portions 142 connecting the pair of connecting portions 138 and the active pillar 132. In such case, the pair of expanding portions 142 may be disposed within the active region AR, and the pair of connecting portions 138 may be disposed within the peripheral region PR and may branch from the active region 132 and the pair of expanding portions 142.

A distance between the lower peripheral pillars 134 may be the same as a distance between the active pillars 132, and a distance between the extending portions 140 of the upper peripheral pillars 136 may be smaller than the distance between the active pillars 132. That is, the active pillars 132 and the lower peripheral pillars 134 may have a first pitch, and the extending portions 140 of the upper peripheral pillars 136 may have a second pitch smaller than the first pitch. For example, the first pitch may be twice the second pitch.

Further, the lower peripheral pillars 134 may have the same width as the active pillars 132, and the upper peripheral pillars 136 may have a smaller width than the active pillars 132. That is, the active pillars 132 and the lower peripheral pillars 134 may have a first width, and the upper peripheral pillars 136 may have a second width smaller than the first width. For example, the first width may be twice the second width.

Referring again to FIGS. 1 to 3, the super junction semiconductor device 100 may include gate electrodes 160 disposed on the semiconductor layer 120, and gate insulating layers 162 disposed between the semiconductor layer 120 and the gate electrodes 160. Specifically, the gate electrodes 160 may be disposed on the semiconductor layer 120 between the body regions 150 and 152, and may extend parallel to each other in the Y-axis direction.

Source regions 154 may be formed in surface portions of the body regions 150 and 152. In particular, the body regions 150 and 152 may include first body regions 150 disposed in the active region PR and second body regions 152 disposed in the peripheral region PR. That is, the first body regions 150 may be connected to the active pillars 132, and the second body regions 152 may be connected to the upper peripheral pillars 136. In such case, the source regions 154 may be formed in surface portions of the first body regions 150.

An interlayer insulating layer 164 may be formed on the gate electrodes 160 and the body regions 150 and 152, and a source electrode 170 may be formed on the interlayer insulating layer 164. The source electrode 170 and the source regions 154 may be connected to each other by source contacts 166 extending in the vertical direction through the interlayer insulating layer 164. In particular, as shown in FIG. 2, the source contacts 166 may pass through the source regions 154 and be connected to the first body regions 150, and thus the source contacts 166 may function as body contacts for applying a bias voltage to the first body regions 150.

Additionally, as shown in FIG. 3, the source electrode 170 may be connected to the second body regions 152 by body contacts 168 extending in the vertical direction through the interlayer insulating layer 164. As a result, in the turn-off state of the super junction semiconductor device 100, a reverse bias voltage may be applied from the source electrode 170 to the first body regions 150 and the second body regions 152 through the source contacts 166 and the body contacts 168.

A drain electrode 172 may be formed on a lower surface of the substrate 102, and the active region AR of the semiconductor layer 120 may function as a drift region that provides a conductive path for drift current flowing from the drain electrode 172 to the source electrode 170 in the turn-on state of the super junction semiconductor device 100.

For example, a high-concentration N-type semiconductor substrate may be used as the substrate 102, and the substrate 102 may function as a drain region between the semiconductor layer 120 and the drain electrode 172. The semiconductor layer 120 may be an N-type epitaxial layer formed on the substrate 102 through an epitaxial growth process, and portions of the semiconductor layer 120 between the pillars 130 may function as N-type pillars.

The pillars 130 may be formed through an ion implantation process after forming the semiconductor layer 120. Specifically, the pillars 130 may be P-type impurity regions and may be formed by repeatedly performing ion implantation processes while varying the ion implantation depth.

The body regions 150 and 152 may be formed through an ion implantation process between the pillars 130 and the upper surface of the semiconductor layer 120, and may be P-type impurity regions with a relatively higher impurity concentration than the pillars 130. The source regions 154 may be formed in surface regions of the first body regions 150 through an ion implantation process, and may be high-concentration N-type impurity regions.

In the turn-off state of the super junction semiconductor device 100, a reverse bias voltage may be applied to the source electrode 170, and accordingly, an interior of the semiconductor layer 120 may be in a depleted state. In particular, while the source regions 154 are formed in the first body regions 150, the source regions 154 are not formed in the second body regions 152. According to the prior art, for the above-described reasons, the upper portions of the peripheral region PR may not be sufficiently depleted, and accordingly, the electric field may be concentrated in the upper portions of the peripheral region PR. However, in accordance with an embodiment of the present disclosure, the upper peripheral pillars 136 formed below the second body regions 152 may relatively increase the PN junction area, and thus, the interior of the semiconductor layer 120 may be fully depleted. As a result, it is possible to prevent the electric field from being concentrated in the upper portions of the peripheral region PR.

Meanwhile, the second pillars 146 may disposed within the side portions of the peripheral region PR disposed on both sides of the active region AR in the X-axis direction. In order to form the interior of the semiconductor layer 120 in a fully depleted state, the second pillars 146 may have a third pitch that is smaller than the first pitch of the active pillars 132. That is, a distance between the second pillars 146 may be narrower than the distance between the active pillars 132, and may be appropriately adjusted to fully deplete the semiconductor layer 120.

Referring again to FIG. 1, the semiconductor layer 120 may include a transition region TR disposed between the active region AR and the peripheral region PR. For example, a portion of the active region AR adjacent to the peripheral region PR may be used as the transition region TR. In such case, the pillars 130 may extend across the transition region TR in the Y-axis direction.

Figure 6:
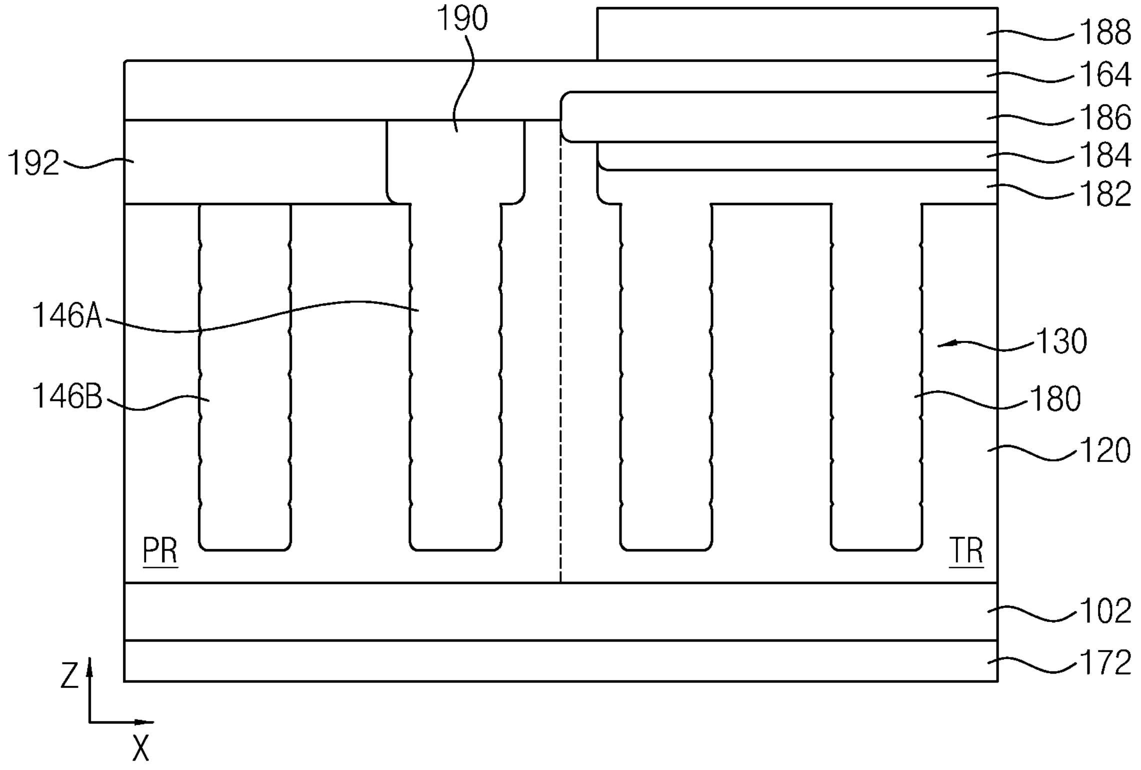
FIG. 6 is a schematic cross-sectional view illustrating a transition region as shown in FIG. 1.

FIG. 6 is a schematic cross-sectional view illustrating a transition region as shown in FIG. 1.

Referring to FIG. 6, the pillars 130 may include transition pillars 180 extending in the Y-axis direction within the transition region TR of the semiconductor layer 120. Specifically, the transition pillars 180 may be connected to the active pillars 132 in the Y-axis direction, and a diffusion region 182 having a plate shape and the second conductivity type, that is, a P-type diffusion region 182, may be formed on the transition pillars 180. The P-type diffusion region 182 may be connected to the first body regions 150. For example, the P-type diffusion region 182 may be formed at the same time as the body regions 150 and 152, and may have the same impurity concentration as the body regions 150 and 152.

A reverse recovery region 184 may be formed on the P-type diffusion region 182 to reduce resistance to reverse recovery current. For example, a P-type reverse recovery region 184 may be formed on the P-type diffusion region 182. In such case, the P-type reverse recovery region 184 may have a higher impurity concentration than the P-type diffusion region 182.

A field oxide region 186 may be formed on the reverse recovery region 184, and the interlayer insulating layer 164 may be formed on the field oxide region 186. In addition, a gate pad 188 electrically connected to the gate electrodes 160 may be formed on the interlayer insulating layer 164.

Meanwhile, the second pillars 146 may be formed in a side portion of the peripheral region PR adjacent to the transition region TR. In particular, as shown in FIG. 6, a second P-type diffusion region 190 having the same impurity concentration as the body regions 150 and 152 may be formed on a second pillar 146A adjacent to the active region AR and the transition region TR among the second pillars 146. Further, a P-type RESURF (Reduced Surface Field) region 192 may be formed to extend from the second P-type diffusion region 190 in the X-axis direction and the Y-axis direction. At this time, the P-type RESURF region 192 may be disposed on the remaining second pillars 146B as shown in FIG. 6, and may have a lower impurity concentration than the second P-type diffusion region 190. The second P-type diffusion region 190 and the P-type RESURF region 192 may be used to sufficiently deplete the peripheral region PR, thereby increasing the breakdown voltage of the super junction semiconductor device 100.

In accordance with the embodiments of the present disclosure as described above, the upper peripheral pillars 136 branching from the active pillars 132 in the Y-axis direction and branching upward from the lower peripheral pillars 134 may be disposed in the upper portions of the peripheral region PR. The upper peripheral pillars 136 may increase PN junction area in the upper portions of the peripheral region PR. Accordingly, the electric field may be prevented from being concentrated in the upper portions of the peripheral region PR, and thus, the breakdown voltage of the super junction semiconductor device 100 may be significantly improved.

Although the example embodiments of the present disclosure have been described with reference to the specific embodiments, they are not limited thereto. Therefore, it will be readily understood by those skilled in the art that various modifications and changes can be made thereto without departing from the spirit and scope of the present disclosure defined by the appended claims.

The invention claimed is:

1. A pillar structure comprising:

a semiconductor layer having a first conductivity type, the semiconductor layer comprising an active region and a peripheral region surrounding the active region; and pillars having a second conductivity type, the pillars extending in a vertical direction within the semiconductor layer and extending in a horizontal direction across the active region and the peripheral region, wherein each of the pillars comprises an active pillar disposed within the active region, a lower peripheral pillar disposed within the peripheral region and connected to the active pillar, and a pair of upper peripheral pillars disposed on the lower peripheral pillar and branching from the active pillar, wherein the pair of upper peripheral pillars branch upward from the lower peripheral pillar, the pair of upper peripheral pillars branch from an interface between the active region and the peripheral region, and comprise a pair of connecting portions connected to the active pillar and a pair of extending portions each extending in the horizontal direction from the pair of connecting portions, and the pair of connecting portions are spaced apart from each other on the interface, the active pillars and the lower peripheral pillars are arranged at a first pitch, and the extending portions of the upper peripheral pillars are arranged at a second pitch smaller than the first pitch, and each of the active pillars and the lower peripheral pillars has a first width, and each of the upper peripheral pillars has a second width smaller than the first width, the first width being twice the second width.

2. The pillar structure of claim 1, further comprising:

body regions having the second conductivity type and each disposed between an upper surface of the semiconductor layer and the pillars.

3. The pillar structure of claim 1, wherein a distance between the pair of connecting portions gradually increases in the horizontal direction.

4. The pillar structure of claim 1, wherein each of the pillars further comprises a pair of expanding portions disposed within the active region and connecting the connecting portions and the active pillar.

5. A super junction semiconductor device comprising:

a substrate having a first conductivity type;

a semiconductor layer having the first conductivity type and disposed on the substrate, the semiconductor layer comprising an active region and a peripheral region surrounding the active region;

pillars having a second conductivity type, the pillars extending in a vertical direction within the semiconductor layer and extending in a horizontal direction across the active region and the peripheral region; and body regions having the second conductivity type and each disposed between an upper surface of the semiconductor layer and the pillars, wherein each of the pillars comprises an active pillar disposed within the active region, a lower peripheral pillar disposed within the peripheral region and connected to the active pillar, and a pair of upper peripheral pillars disposed on the lower peripheral pillar and branching from the active pillar, wherein the pair of upper peripheral pillars branch upward from the lower peripheral pillar, the pair of upper peripheral pillars branch from an interface between the active region and the peripheral region, and comprise a pair of connecting portions connected to the active pillar and a pair of extending portions each extending in the horizontal direction from the pair of connecting portions, and the pair of connecting portions are spaced apart from each other on the interface, the active pillars and the lower peripheral pillars are arranged at a first pitch, and the extending portions of the upper peripheral pillars are arranged at a second pitch smaller than the first pitch, and each of the active pillars and the lower peripheral pillars has a first width, and each of the upper peripheral pillars has a second width smaller than the first width.

6. The super junction semiconductor device of claim 5, wherein a distance between the pair of connecting portions gradually increases in the horizontal direction.

7. The super junction semiconductor device of claim 5, wherein each of the pillars further comprises a pair of expanding portions disposed within the active region and connecting the connecting portions and the active pillar.

8. The super junction semiconductor device of claim 5, further comprising:

gate electrodes extending in the horizontal direction and disposed on the semiconductor layer between the body regions;

gate insulating layers disposed between the semiconductor layer and the gate electrodes; and source regions disposed in surface portions of the body regions.

9. The super junction semiconductor device of claim 8, wherein the body regions comprise first body regions disposed in the active region and second body regions disposed in the peripheral region, and the source regions are disposed in surface portions of the first body regions.

10. The super junction semiconductor device of claim 9, further comprising:

an interlayer insulating layer disposed on the gate electrodes and the body regions;

a source electrode disposed on the interlayer insulating layer; and source contacts connecting the source electrode and the source regions through the interlayer insulating layer.

11. The super junction semiconductor device of claim 10, wherein the source contacts are connected to the first body regions through the source regions.

12. The super junction semiconductor device of claim 10, further comprising:

body contacts connecting the source electrode and the second body regions through the interlayer insulating layer.

13. The super junction semiconductor device of claim 5, wherein the semiconductor layer further comprises a transition region disposed between the active region and the peripheral region, and the pillars extend across the transition region in the horizontal direction.

14. The super junction semiconductor device of claim 13, wherein the pillars further comprise transition pillars disposed in the transition region, a diffusion region having the second conductivity type is disposed on the transition pillars, and a reverse recovery region having the second conductivity type and an impurity concentration higher than that of the diffusion region is disposed on the diffusion region.

15. The super junction semiconductor device of claim 13, further comprising:

second pillars having the second conductivity type, the second pillars extending in the vertical direction and the horizontal direction within a portion of the peripheral region disposed on one side of the transition region.

16. The super junction semiconductor device of claim 15, wherein a second diffusion region having the second conductivity type is disposed on a second pillar adjacent to the transition region among the second pillars, and a reduced surface field region having the second conductivity type and having an impurity concentration lower than that of the second diffusion region is disposed on remaining second pillars.

* * * * *